United States Patent [19]
Bucholtz et al.

[11] Patent Number: 5,491,335
[45] Date of Patent: Feb. 13, 1996

[54] FIBER OPTIC TRANSDUCER WITH FLUID COUPLING MEANS BETWEEN OPTICAL FIBER AND TRANSDUCTION MATERIAL

[75] Inventors: Frank Bucholtz, Crofton, Md.; James A. McVicker, Alexandria, Va.

[73] Assignee: The United States of America as represented by the Secretary of the Navy, Washington, D.C.

[21] Appl. No.: 298,698

[22] Filed: Aug. 31, 1994

[51] Int. Cl.⁶ .................................................. H01J 5/16
[52] U.S. Cl. .......................... 250/227.25; 250/227.24; 250/227.27
[58] Field of Search ................... 250/227.27, 227.25, 250/227.24; 385/12, 39, 48, 50

[56] References Cited

U.S. PATENT DOCUMENTS

| | | | |
|---|---|---|---|
| 4,376,248 | 3/1983 | Giallorenzi et al. | |
| 4,378,497 | 3/1983 | Giallorenzi. | |
| 4,442,350 | 4/1984 | Rashleigh. | |
| 4,603,296 | 7/1986 | Koo et al. | 324/244 |
| 4,644,273 | 2/1987 | Bobb | 324/244 |
| 4,789,240 | 12/1988 | Bush | 356/345 |
| 4,928,006 | 5/1990 | Kershaw | 250/227.25 |
| 4,942,767 | 7/1990 | Haritonidis | 250/227.27 |
| 5,095,514 | 3/1992 | Curtis | 385/12 |
| 5,305,075 | 4/1994 | Bucholtz et al. | 356/345 |
| 5,367,376 | 11/1994 | Lagakos | 385/12 |

OTHER PUBLICATIONS

M. Wun–Fogle et al., "Sensitive, Wide Frequency Range Magnetostrictive Strain Gage", Proc. Sensors '86, Detroit, Michigan, Nov. 11–13, 1986, Paper IQ86–942, Cover Page and pp. IQ86–942–1 through IQ86–942–9.

M. Wun–Fogle et al., "Permeability in Frozen High Magnetomechanical Coupling Amorphous Ribbons", *Journal of Magnetism and Magnetic Materials*, vol. 54–57, pp. 893–894 (1986). (No Month).

M. D. Mermelstein et al., "Stress–Relieved Magnetoelastic Amorphous Metal DC Magnetometer", Electron. Lett., vol. 23(6), pp. 280–281 (1987). (No Month).

M. D. Mermelstein et al., "Measurement of the Piezomagnetic Modulus of a Field Annealed Amorphous Metal Ribbon", presented at *Intermag '87*, Tokyo, 3 pages (Apr. 1987).

F. Bucholtz et al., "Fiber Optic Magnetometers Using Planar and Cylindrical Magnetostrictive Transducers", *SPIE*. vol. 718, Fiber Optic and Laser Sensors IV, pp. 128–133 (1986). (No Month).

Primary Examiner—Edward P. Westin
Assistant Examiner—Jacqueline M. Steady
Attorney, Agent, or Firm—Thomas E. McDonnell; George Jameson

[57] ABSTRACT

A fiber optic transducer includes a fiber optic cable or ribbon, a sensor, fluid material for coupling the fiber optic medium to the sensor and an affixing material to optionally affix the position of the sensor position relative to the fiber optic ribbon by affixing only one end of the sensor to the fiber optic ribbon. The sensor can be made from either magnetostrictive or electrostrictive materials. The coupling fluid enables the transducers to be manufactured with substantially similar frequency responses across a range of frequencies.

32 Claims, 8 Drawing Sheets

FIBER OPTIC TRANSDUCER WITH FLUID COUPLING MEANS BETWEEN OPTICAL FIBER AND TRANSDUCTION MATERIAL

BACKGROUND OF THE INVENTION

1. Field of the Invention

This invention relates to a fiber optic transducer which uses a fluid to couple a sensor to a fiber optic medium.

2. Description of Related Art

Optical fiber sensor transducers are commonly used in the measurement of magnetic fields H and electric fields E. In response to either a magnetic or electric field, a magnetostrictive or electrostrictive sensor material, respectively, changes its physical geometry. When the direction of interest is the sensor length, L, the proportional change in sensor length is called the strain:

$$e = \Delta L/L \quad (1)$$

where e is the strain, L is the starting length of the sensor and $\Delta L$ is the change in length. A coupling material, such as an adhesive, binds the sensor material and optical fiber together and transfers the strain from the sensor material to the optical fiber, causing the length of the fiber to correspondingly change. As light travels through the optical fiber, the change in the length of the fiber changes the path length of the light, creating a phase shift in the light at a receiving end of the optical fiber.

A known fiber optic transducer uses materials in which the strain can be expressed as a nonlinear function of H or E. Typically $$e = CH^2 \quad (2)$$

for magnetostrictive materials, and $$e = ME^2 + QE \quad (3)$$

for electrostrictive materials, where the coefficients C, M, and Q depend on the transducer sensor material, the transducer geometry, and the frequency. C is the magnetostrictive coefficient, M is the electrostrictive coefficient and Q is the piezoelectric coefficient. These coefficients are determined by the sensor material geometry and the frequency of the measured field.

The frequency of the measured electric or magnetic field is the rate at which the field's intensity or amplitude is changing with respect to time. The amplitude of a DC field is constant in time while the amplitude of an AC field varies with time. The sinusoidal time variation in the amplitude of the AC field is given by $h\sin(\omega t)$, where h is the peak amplitude, $\omega$ is the frequency of the sine wave in radians per second, and t is time in seconds. When the magnetostrictive or electrostrictive sensor is exposed to a sinusoidal magnetic or electric field, the strain e varies sinusoidally at the same frequency. When the sensor is simultaneously exposed to two sinusoidal magnetic or electric fields having frequencies of $\omega$ and $\Omega$ and amplitudes h and H respectively, the strain is derived by standard techniques and expressed as the sum and difference of the frequencies $\omega$ and $\Omega$:

$$e(\omega \pm \Omega) = ChH_\Omega \sin(\omega \pm \Omega)t \quad (4)$$

Usually the higher of the two frequencies is called the carrier frequency, and the lower of the two frequencies is called the signal frequency.

These fiber optic transducers are conventionally used to measure a low frequency magnetic field $H_\Omega \sin(\Omega t)$ by applying a higher frequency field $h\sin(\omega t)$ into the magnetostrictive material and detecting the strain at the sum and the difference frequencies ($\omega + \Omega$ and $\omega - \Omega$, respectively). Since h and $\omega$ are known, $H_\Omega$ and $\Omega$ are easily obtained from equation (4). By coupling the magnetostrictive material to an optical fiber containing traveling light waves, the strain transferred from the magnetostrictive sensor material to the optical fiber induces a shift in the phase of the light wave by $$\phi(\omega \pm \Omega) = 2\pi n \xi L \eta ChH_\Omega \sin(\omega \pm \Omega)t \quad (5)$$

where $\phi$ is the phase shift, n is the index of refraction of the fiber core of the optical fiber, $\xi$ is the strain-optic coefficient, L is the length of the optical fiber which is attached to the magnetostrictive sensor material, and $\eta$ is the strain-transfer coupling efficiency. The phase shift is easily detected by standard interferometer techniques.

When the sensor material is coupled to the optic fiber using hard adhesives, such as epoxy, the adhesive itself introduces dimensional constraints on the transducer. Since the change in physical length is the only mechanism available for the sensor material to transfer the detected magnetic or electric field to the fiber optic cable, the hard adhesive is not an ideal coupling material because it interferes with this mechanism by restraining the sensor material, preventing it from freely expanding or contracting in response to the applied or measured field. In addition, the adhesive responds to environmental conditions, such as temperature, humidity and other time dependent parameters, independently of the sensor.

Accordingly, hard adhesives cause three deleterious effects:

1) the adhesive restricts the strain of the sensor material. This mechanical loading reduces the effective strain generated per applied field; 2) time-dependent variations in the adhesive cause time-dependent fluctuations in the coupling factor $\eta$; 3) for magnetostrictive sensors, the adhesive induces local strains in the magnetostrictive sensor material, thus reorienting the local magnetic easy axis and decreasing the magnetostrictive response C. Additionally, all three effects interfere with the ability to reproduce substantially similar responses from transducer to transducer.

SUMMARY OF THE INVENTION

The inventors have discovered that these problems are reduced significantly by using a fluid as the strain transfer medium instead of a hard adhesive. The fluid acts as a high-pass filter for the mechanical strain. In equation (5), the AC strain at the frequencies $\omega \pm \Omega$ is measured in terms of phase shift. The DC strain is irrelevant and can have an adverse effect on the sensor performance when the DC strain is also transferred to the fiber. When the proper fluid is chosen, the AC strain is transmitted without static or quasistatic strain generated by static or quasistatic stress.

The AC strain can arise either from a high frequency external field that is being detected or from an applied field serving as a carrier for detecting a low frequency external field. When the field to be measured is a high frequency AC field, a DC bias field is applied to the fiber optic transducer, and equations (2) and (3) can be used to detect the high frequency AC fields.

This invention therefore provides a fiber optic transducer having a fluid coupling a fiber optic medium to a sensor. This invention also provides a coupling fluid comprising a silicone paste compound. This invention further provides for a method for using a fluid to couple a fiber optic medium to a sensor.

DETAILED DESCRIPTION OF THE PREFERRED EMBODIMENTS

FIGS. 1–4 show a first preferred embodiment of a fiber optic transducer 10 of this invention. A fiber optic ribbon 14 is coupled to a strip of sensor material or sensor strip 12 by a layer of coupling fluid 18, which is uniform and bubble free. The sensor strip 12 may be optionally affixed or secured to the fiber optic ribbon 14 by a hard adhesive or epoxy 16 at one end 12a of the sensor strip 12, leaving the second end 12b of the sensor strip 12 free. The epoxy 16 is used when the coupling fluid 18 is unable to maintain the sensor strip and the fiber optic ribbon in a desired relative position for the full duration of an extended use. For some applications, the epoxy 16 at end 12a may not be needed. In contrast, for applications where long term deployment of the fiber optic transducer 10 is contemplated and the in-use position of the fiber optic transducer 10 is unknown, the epoxy 16 at end 12a may be necessary to prevent the sensor strip 12 from slipping relative to the fiber optic ribbon 14.

Figure 1:
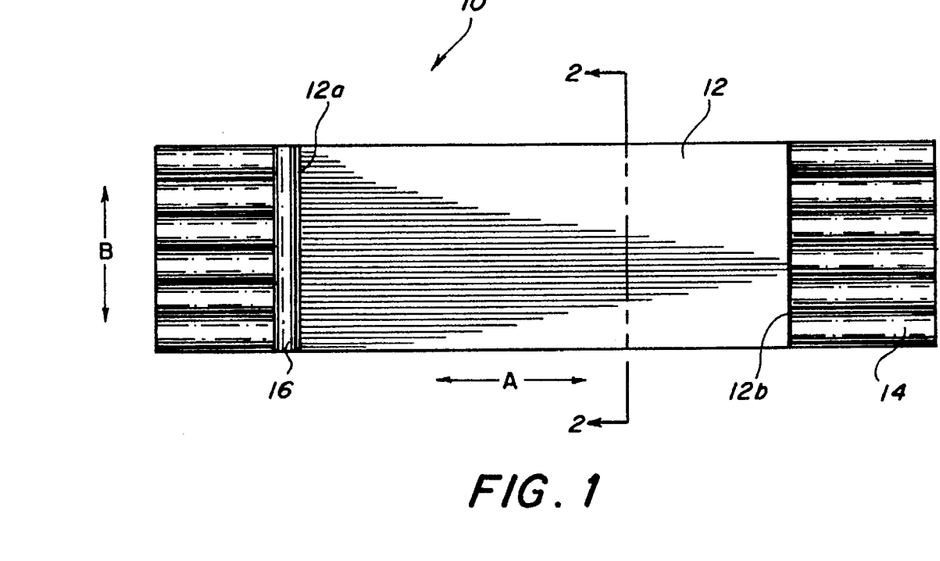
FIG. 1 shows a top plan view of a first preferred embodiment of the fiber optic transducer.
Figure 2:
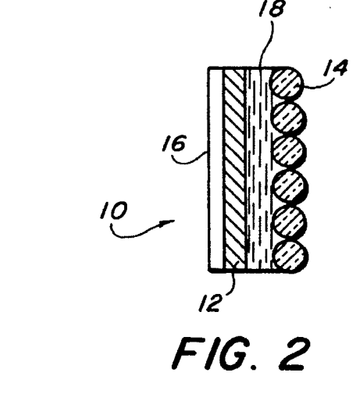
FIG. 2 is a sectional view of the fiber optic transducer.
Figure 3:
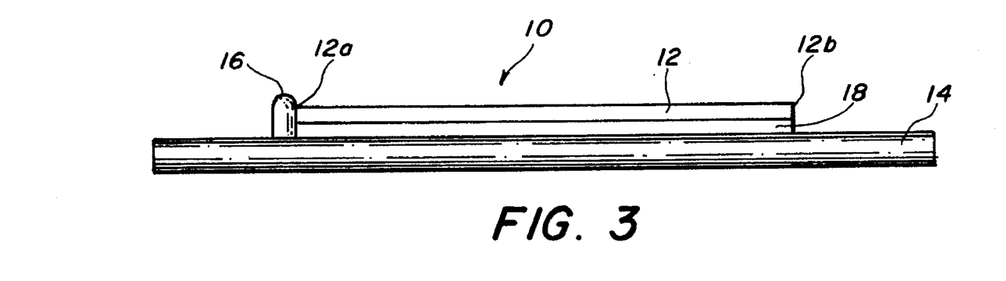
FIG. 3 shows a side plan view of the fiber optic transducer.
Figure 4:
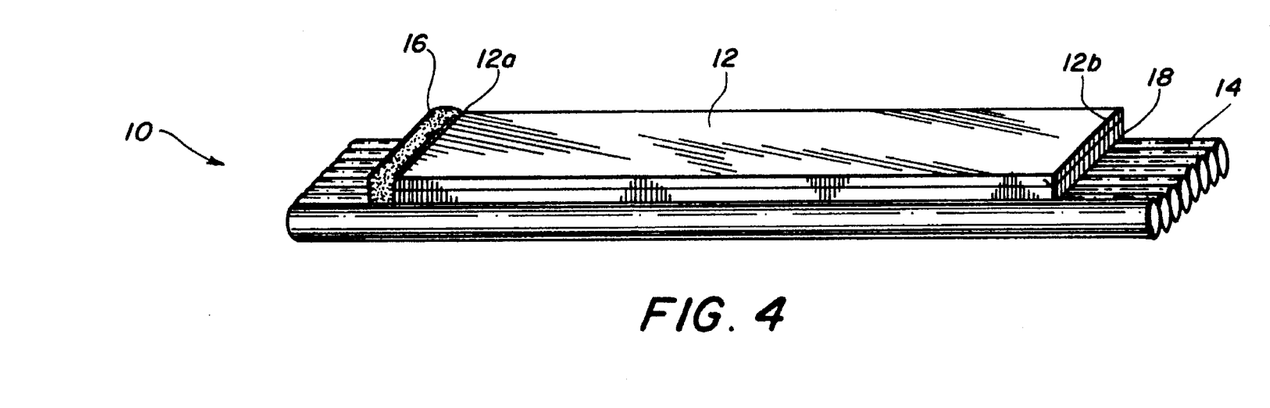
FIG. 4 is a perspective view of the fiber optic transducer.
Figure 5:
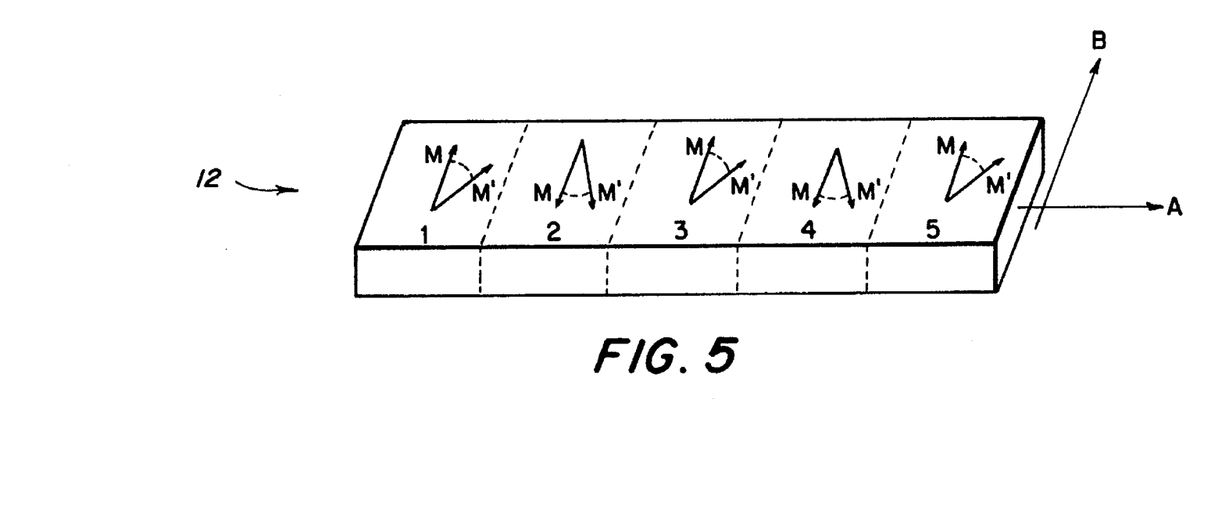
FIG. 5 shows magnetic domains within a magnetostrictive sensor material.

When the sensor material 12 is magnetostrictive, the magnetic domains, as shown in FIG. 5, are preoriented in a transverse direction B perpendicular to the longitudinal direction A of the transducer 10 by annealing the material in the presence of a DC magnetic field. The epoxy 16 affixing the sensor material 12 to the fiber optic ribbon 14 can be any known hard adhesive. The fiber optic ribbon 14 is preferably a single fiber looped around multiple times to multiply the strain transferred to the optic fiber to generate a maximum light phase shift per unit of detected magnetic field.

When the sensor material 12 is a magnetostrictive strip and a magnetic field is applied, the sensor material having positive magnetostriction changes length corresponding to the magnitude and direction of the magnetic field. As shown in FIG. 5, the magnetostrictive strip 12 has idealized magnetic domains 1-5 with magnetic moments as shown by the arrows M within each domain. After the annealing process, all the magnetic moments M point along the direction B of a DC annealing magnetic field, $H_{anneal}$, which is perpendicular to the longitudinal axis A of the strip 12. When subjected to a magnetic field H, aligned along the longitudinal direction A of the strip 12, the magnetic moments M rotate in the direction shown by the dashed arrows to elastically realign the magnetic moments M' closer to the longitudinal direction A of the strip 12 and the applied magnetic field H. This movement of the magnetic moments M causes a physical lengthening of the magnetostrictive strip. When all of the magnetic domains are aligned along the longitudinal direction A, the magnetostrictive strip 12 reaches its maximum length. When the magnetic domains are aligned perpendicular to the longitudinal direction A, the sensor strip 12 is at its minimum length. Any change in the magnetic field incident on the magnetic sensor strip 12 in the longitudinal direction A produces a corresponding change in the length of the sensor strip 12.

Figure 8:
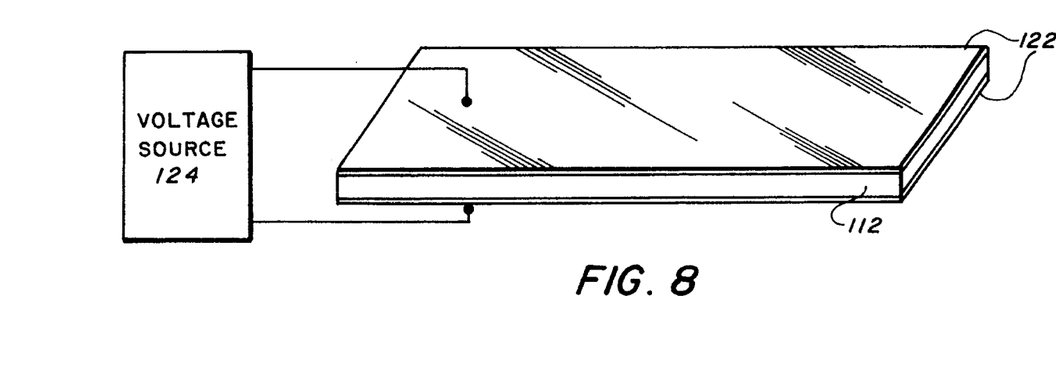
FIG. 8 is a diagram of a voltage source applied across an electrostrictive sensor material.

Electrostrictive sensors, such as the sensor shown in FIG. 8 (to be discussed), behave similarly to magnetostrictive sensors, but the physics is completely different. In electrostrictive sensor strips 112, the crystal lattice of the electrostrictive material changes length in response to applied electric fields, causing corresponding dimensional changes in the electrostrictive sensor strip 112. The relationship between the magnitude of the field applied to the sensor strip 112 and the corresponding change in the length of the sensor strip 112 is expressed by equation 3.

Magnetostrictive and electrostrictive materials are available that have strain responses for a wide range of applied field strengths. Examples of magnetostrictive materials that have large strain responses at low amplitude applied fields are iron, nickel, Terfenol (a commonly used name for a terbium-iron alloy developed at the Naval Ordinance Laboratory), and metallic glass alloys such as METGLAS® from Metglas Products Div. 26055-2, Allied Signal Inc., Parsippany, N.J. 07054. These materials typically have strain responses of about 30 ppm (parts per million) for low amplitude applied fields. Examples of electrostrictive materials are barium-doped lead zirconium titanate and lead magnesium niobate-lead titanate.

The undesirable effects of a hard adhesive coupling together the sensor strip 12 and the optic fiber ribbon 14 are overcome by using the coupling fluid 18 as the coupling material. The coupling fluid 18, such as silicone paste or oil, does not impose any static structural forces and thus avoids all of the drawbacks of the hard adhesives.

Figure 6:
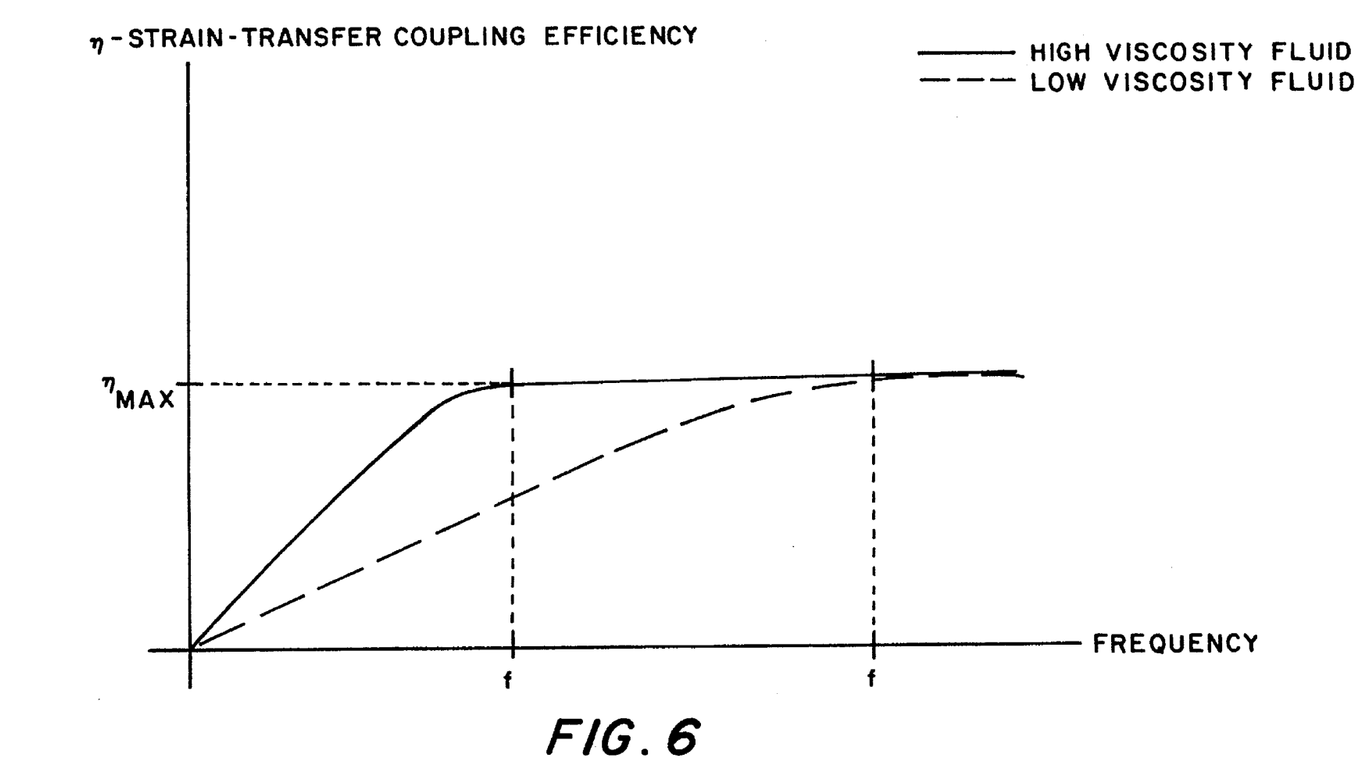
FIG. 6 is a graph of strain coupling efficiency for high and low viscosity fluids.

FIG. 6 shows the graphs of the strain-transfer coupling efficiency η across sensor vibration frequency for a high viscosity fluid and a low viscosity fluid. At a frequency of 0, or static strain, the strain-transfer coupling efficiency η is 0 since fluids cannot secure the sensor material 12 to the fiber optic ribbon 14. As the frequency of the sensor vibrations increases, η increases until the maximum strain-transfer coupling efficiency, $\eta_{max}$, for that fluid is reached. As indicated by FIG. 6, for higher viscosity fluids, $\eta_{max}$ is reached at a lower frequency than for lower viscosity fluids. When the sensor vibration frequency is far above the frequency where η reaches $\eta_{max}$ for a wide range of fluids, the selection of fluids becomes independent of the strain-transfer coupling efficiency η and is thus dictated by other considerations such as availability or ease of use. Examples of fluids that provide satisfactory strain-transfer coupling efficiency include polydimethylsiloxane, trimethylsiloxy terminated, Dow Corning High Vacuum® grease (silicone) from Dow Corning Corporation, Midland, Mich. 48686-0994, Apezion Type H High Vacuum® grease from GEC Alsthom (MSI) Ltd., P.O. Box 136, Manchester M60 1AN, England, Synco Superlube Teflon Lubricant® (silicone-base) from Synco Chemical Corporation, Bohemia, N.Y. 11716, heavy mineral oil, household oil and motor oil. In general, fluids with viscosities of 100–100,000 cs (centistokes) are effective coupling fluids.

The coupling fluid 18 cannot transfer a DC strain from the sensor strip 12 to the optic fiber ribbon 14. When a known alternating field is applied to the transducer 10 (i.e., the carrier frequency ω field), the sensor strip 12 will transfer the alternating strain through the coupling fluid 18 to the optic fiber ribbon 14.

Since the applied magnetic or electric field is known, its contribution can be filtered out, leaving only the signal field caused by other sources. Using this technique, very low frequency alternating fields can be precisely measured.

A DC bias field is necessary when detecting low amplitude AC fields. The sensor material 12 is normally preconditioned to give the largest strain for a specific direction of applied field so that when no field is present, the sensor is at one end of the sensor material's response range. Usually, a very small response is obtained for low intensity fields at this end of the response range. To improve the sensor material's response to a low amplitude AC field, the fiber optic transducer 10 is biased by an applied DC field, so that the sensor material is prestrained to a more responsive portion of the response range, thus allowing for the detection of the low amplitude AC field.

Figure 7:
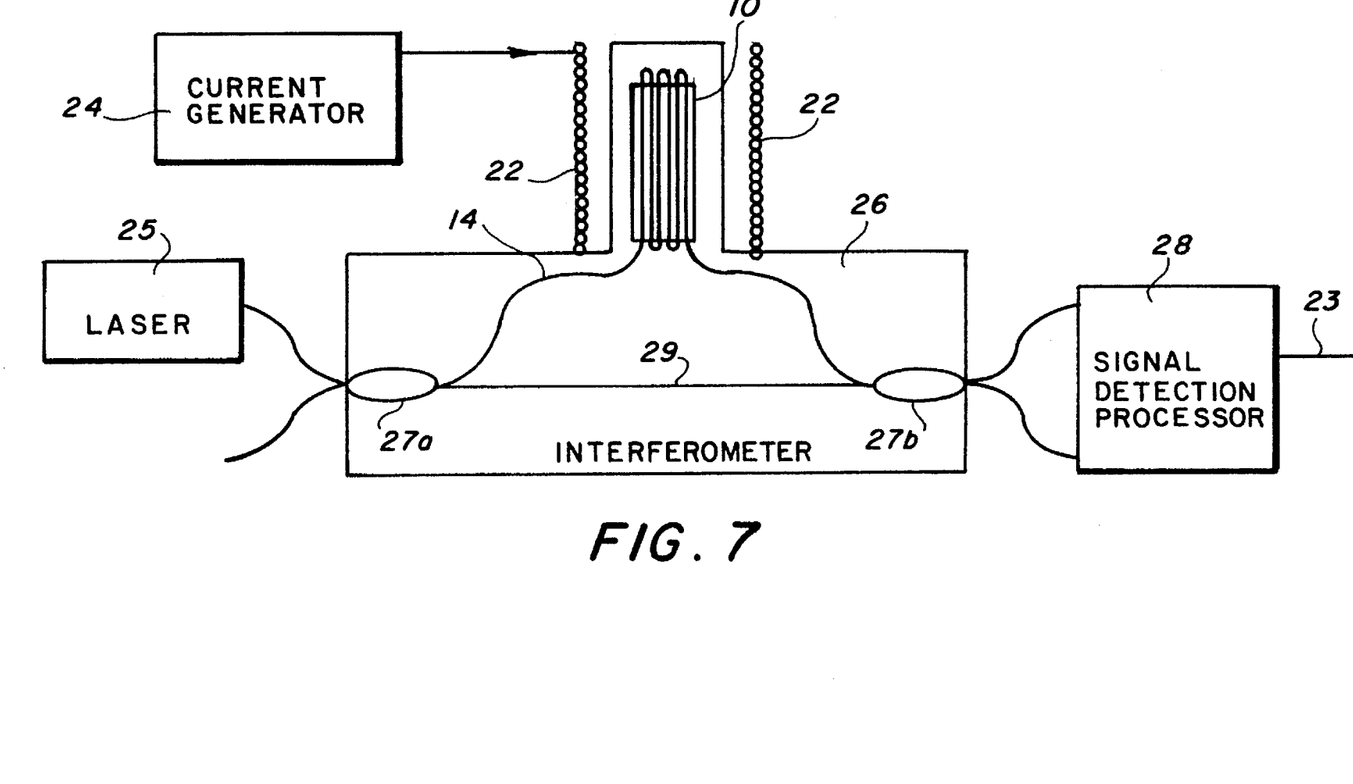
FIG. 7 shows a fiber optic sensor within a coil and connected to an interferometer.

FIG. 7 shows a magnetostrictive fiber optic transducer 10 connected to an interferometer 26 and placed inside a magnetic field produced by a coil 22. The interferometer 26 has a sensor arm comprising the optic fiber 14 of the fiber optic transducer 10, and a reference arm comprising optic fiber 29. Laser light from a laser 25 is input to optic fiber 14 and the light in the optic fiber 14 is coupled to the reference arm 29 by optic fiber coupler 27a. The light from both arms are coupled to each other again by optic fiber coupler 27b after the light in the optic fiber 14 have been phase shifted by the fiber optic transducer 10 and output to a signal detection processor 28. The current generator 24 produces a static or oscillating current in the coil 22 which, in turn, produces a static or oscillating magnetic field at a carrier frequency ω in the transducer 10. When a static magnetic field is used, a permanent magnet can replace the coil 22. Typically, a static field of 1–20 gauss and oscillating fields of 1 milligauss are used.

The signal detection processor 28 receives the output of the interferometer, detects the phase shift generated by the fiber optic transducer 10, removes the carrier contribution to the phase shift when a carrier is present and produces a measurement signal output 23 indicating the amplitude and frequency of the detected external field. The signal detection processor 28 may be designed by techniques well known in the art.

There are many interferometers and corresponding signal detection processes that may be used. The interferometer 26 shown in FIG. 7 is a Mach-Zehnder type interferometer. Examples of other types of interferometers usable with the sensor of this invention include Michelson, Sagnac and Fabry-Perot interferometers, all of which detect the measured field by measuring the induced phase shift. The Fiber Bragg Grating, which is based on light wavelength, and the Polarimeter, which is based on polarization of light, can also be used.

Electrostrictive transducers are similar to the magnetostrictive transducers, with the exception that a static or oscillating electric field is applied to the transducer instead of a magnetic field. In place of the coil 22, two electrodes or plates 122 are formed on two opposing surfaces of the electrostrictive sensor material 112, as shown in FIG. 8. A voltage source 124 produces either a static or oscillating voltage at a carrier frequency ω across plates 122 which in turn produces a static or oscillating field at a carrier frequency ω in the sensor material 112. Typically, electric fields of 1– 1000 V/M can be used.

Figure 9:
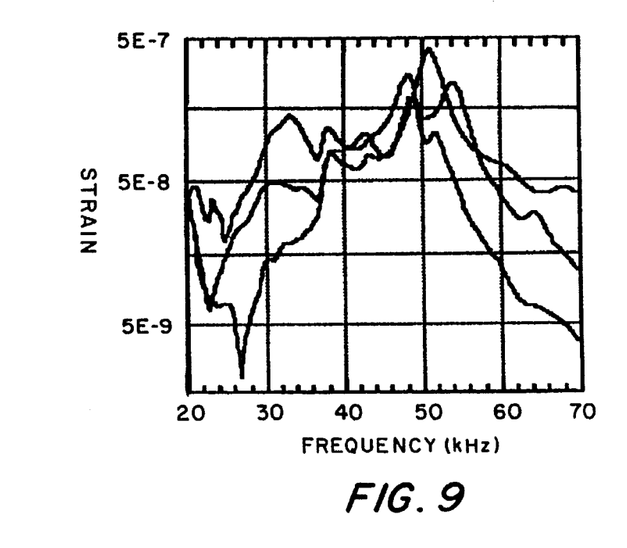
FIG. 9 shows the frequency response of three transducers using a hard adhesive to couple the sensor to the optic fibers.
Figure 10:
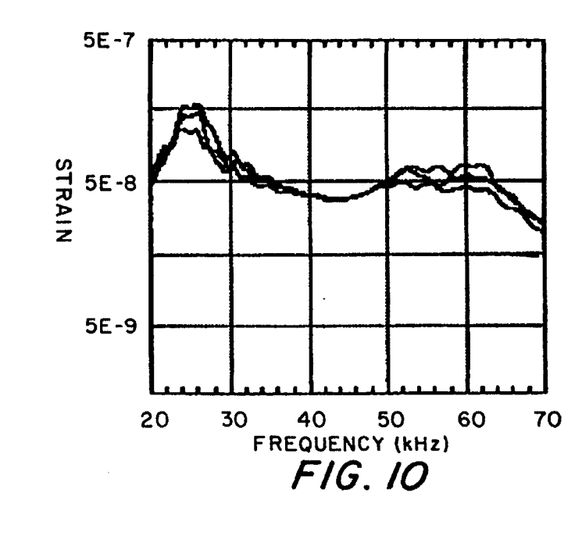
FIG. 10 shows the frequency response of three transducers using a fluid to couple the sensor to the optic fibers.

FIG. 9 shows the frequency response of three fiber optic transducers constructed using a layer of hard epoxy to couple the sensor material 12 (FIGS. 1–4), made of a METGLAS® strip to the fiber optic ribbon 14 (FIGS. 1–4). FIG. 10 shows the frequency response of three identical fiber optic transducers constructed according to this invention using a coupling fluid 18 (FIGS. 1–4) of polydimethylsiloxane trimethylsiloxy terminated to couple the sensor to the fiber optic ribbon 14 (FIGS. 1–4).

As shown by FIGS. 9 and 10, the transducers constructed using the epoxy instead of the silicone paste compound have a wider response variation across the shown frequency range and the frequency response varies greatly from transducer to transducer. The transducers 10 constructed according to this invention have a narrower response variation across the shown frequency range and the frequency response is substantially similar from transducer to transducer.

Figure 11:
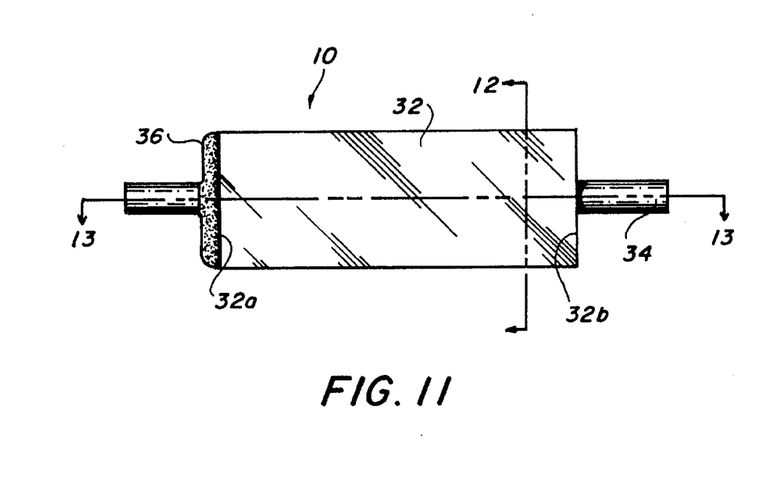
FIG. 11 shows a side plan view of a second preferred embodiment of the fiber optic transducer.
Figure 12:
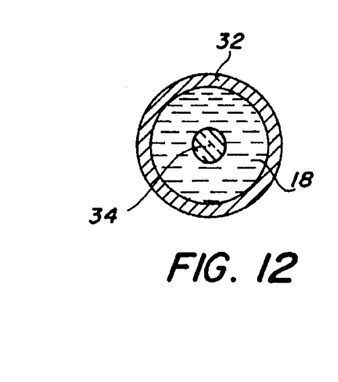
FIG. 12 shows a sectional view of the fiber optic transducer shown in FIG. 11.

FIGS. 11 and 12 show a second preferred embodiment of the transducer 10 of this invention. A portion of a single optical fiber 34 is positioned coaxially inside an annular jacket or annular sensor jacket 32 of sensor material. The space between the optic fiber 34 and the interior wall of the annular sensor jacket 32 is filled with a coupling fluid 18. The optic fiber 34 is optionally affixed by a hard adhesive 36 at one end 32a of the annular sensor jacket 32 while the other end 32b is left free. Of course, one or more optical fibers 34 can be positioned along the axis of the annular sensor jacket. Preferably, additional optical fibers 34 are provided by looping the optical fiber, as in the first preferred embodiment.

Figure 13:
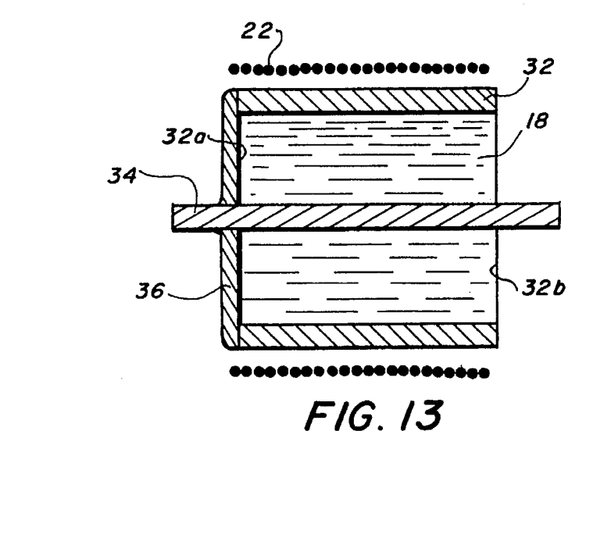
FIG. 13 is a cross-section of the fiber optic transducer of FIG. 11 within a coil.
Figure 14:
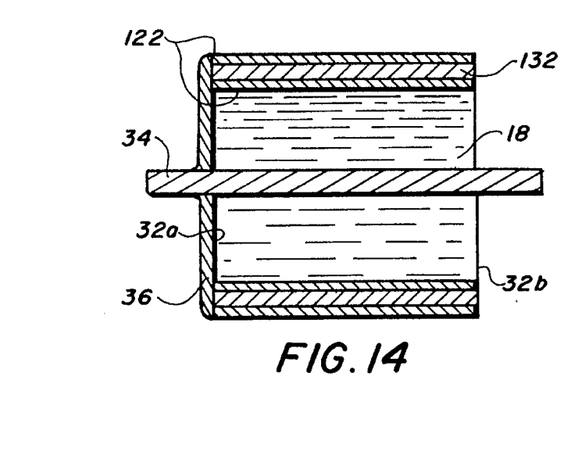
FIG. 14 is a cross-section of the fiber optic transducer of FIG. 11 with electrodes.

FIG. 13 shows a cross-section of a magnetostrictive annular jacket within a coil 22. FIG. 14 shows a cross-section of an electrostrictive annular jacket 132 having electrodes 122 on the interior and exterior walls of the annular jacket 132.

Figure 15:
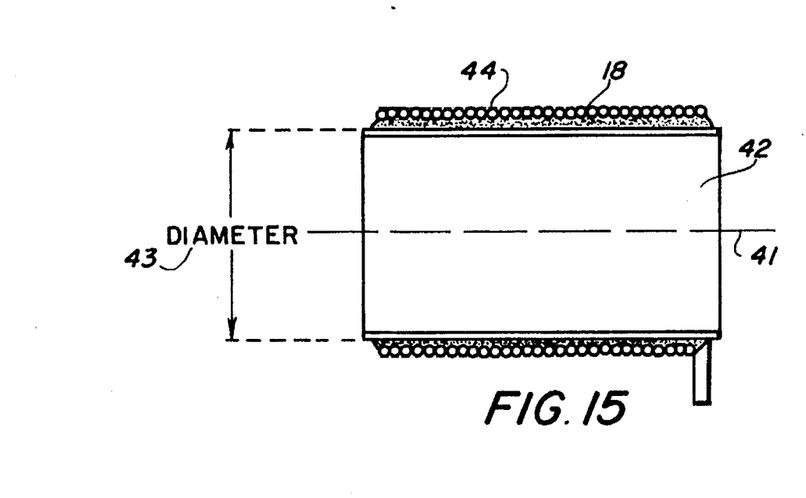
FIG. 15 is a side cross-section of a third preferred embodiment of the fiber optic transducer.
Figure 16:
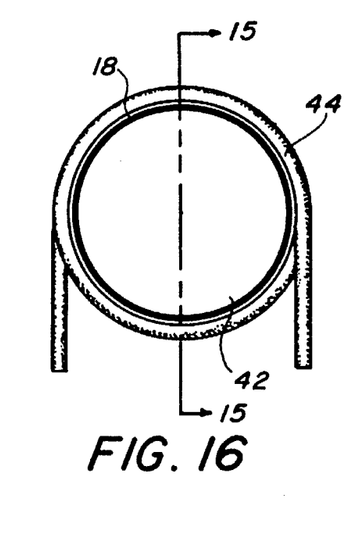
FIG. 16 is an end plan view of the third preferred embodiment of the fiber optic transducer.
Figure 17:
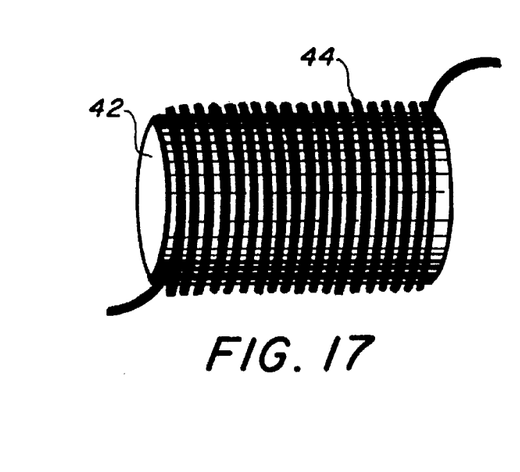
FIG. 17 is a perspective view of the third preferred embodiment of the fiber optic transducer.

FIGS. 15–17 show a third preferred embodiment of this invention. The sensor shown in FIGS. 15–17 comprises a piece of magnetostrictive or electrostrictive material shaped into an annular mandrel 42. The optic fiber 44 is coiled around the exterior cylindrical surface of the annular mandrel 42 and coupled to the annular mandrel 42 by the coupling fluid 18. The sensor material is sensitive to a field along the axis 41 of the annular mandrel 42 and responds to a field in this direction by changing the diameter 43 of the annular mandrel 42, thus producing a strain in the optic fiber coil 44.

Figure 18:
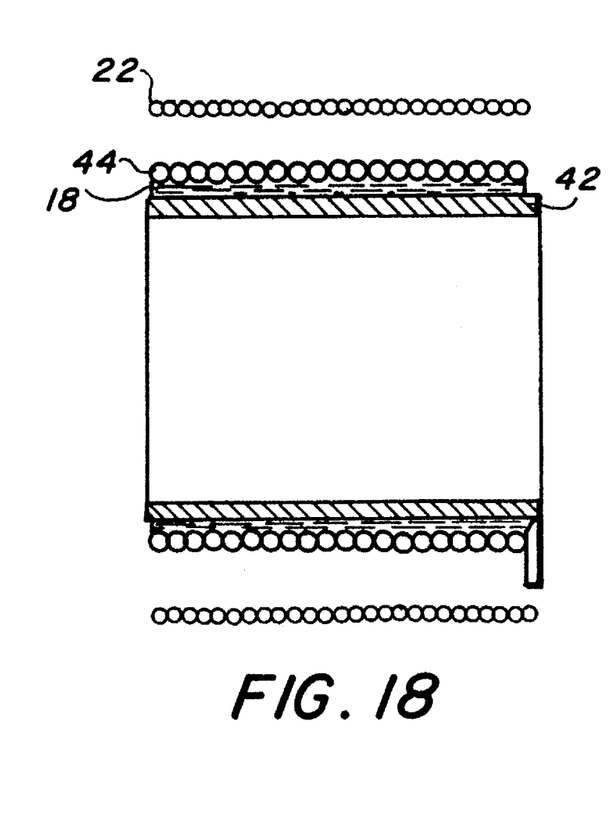
FIG. 18 is the fiber optic transducer of FIG. 15 within a coil.
Figure 19:
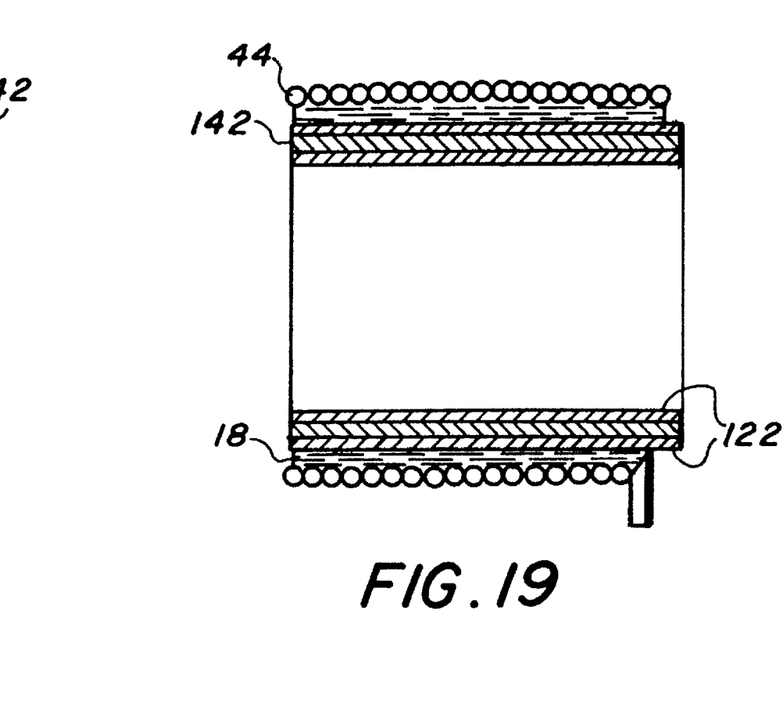
FIG. 19 is a fiber optic transducer of FIG. 15 with electrodes.

FIG. 18 shows a cross-section of an annular mandrel 42 within a coil 22. FIG. 19 shows a cross-section of an electrostrictive annular mandrel 142 having electrodes 122 on the interior and exterior walls of the annular mandrel 142.

This invention is not limited to the embodiments as described above, and various modifications may be made without departing from the subject matter of this invention.

What is claimed and desired to be secured by Letters Patent of the United States is:

1. A fiber optic transducer comprising:

an optical fiber;

a nonlinear transduction material in which strain resulting from an applied field is a nonlinear function of the applied field; and fluid means disposed between said optical fiber and said nonlinear transduction material and having the capability of coupling alternating mechanical strain from said nonlinear transduction material to said optical fiber while simultaneously rejecting static mechanical strain.

2. The fiber optic transducer of claim 1 wherein:

said optical fiber is a fiber optic ribbon;

said nonlinear transduction material is in the form of a flat strip;

said fluid means is provided between said fiber optic ribbon and said flat strip.

3. The fiber optic transducer of claim 2 further including:

means for affixing a first end of said nonlinear transduction material to said fiber optic ribbon.

4. The fiber optic transducer of claim 3 wherein:

said affixing means is an epoxy adhesive.

5. The fiber optic transducer of claim 1 wherein:

said nonlinear transduction material is in the form of an annular jacket, said annular jacket having an interior wall and being coupled to said optical fiber by said fluid means, said annular sensor jacket being positioned around a portion of said optical fiber, said fluid means being provided between said optical fiber and said interior wall of said annular jacket.

6. The fiber optic transducer of claim 5 further including:

means for affixing a first end of said annular jacket to said optical fiber.

7. The fiber optic transducer of claim 6 wherein:

said affixing means is an epoxy adhesive.

8. The fiber optic transducer of claim 1 wherein:

said fluid means is a silicone vacuum grease.

9. The fiber optic transducer of claim 1 further including:

means for affixing a first end of said nonlinear transduction material to said optical fiber.

10. The fiber optic transducer of claim 9 wherein:

said affixing means is an epoxy adhesive.

11. The fiber optic transducer of claim 1 wherein:

said nonlinear transduction material is a magnetostrictive material.

12. The fiber optic transducer of claim 1 wherein:

said nonlinear transduction material comprises an annular mandrel having an exterior surface, said optical fiber being coiled around said exterior surface of said annular mandrel, and said fluid means provided between said exterior surface of said annular mandrel and said optical fiber.

13. A method for manufacturing a fiber optic transducer comprising the steps of:

providing an optical fiber;

providing a nonlinear transduction material in which strain resulting from an applied field is a nonlinear function of the applied field; and providing between the optical fiber and the nonlinear transduction material a fluid having the capability of coupling alternating mechanical strain from the nonlinear transduction material to the optical fiber while simultaneously rejecting static mechanical strain.

14. The method of claim 13 further including the step of:

affixing a first end of the nonlinear transduction material to the optical fiber.

15. The method of claim 14 wherein said affixing step includes the step of:

using an epoxy adhesive to affix the first end of the nonlinear transduction material to the optical fiber.

16. A field detection device for detecting a strength of an external signal field, the device comprising:

means for generating an applied carrier field;

a fiber optic transducer comprising:

a nonlinear transduction material being responsive to the external signal field and the applied field for developing an induced strain therein;

an optical fiber; and fluid means disposed between said optical fiber and said nonlinear transduction material for coupling said nonlinear transduction material to said optical fiber, said fluid means transferring the induced strain in said nonlinear transduction material into said optical fiber;

a light source;

an interferometer incorporating said fiber optic transducer as a sensor arm and receiving light from said light source, said light source sending light through said sensor arm, said sensor arm generating a total parameter shift in the light corresponding to the external signal field and the applied field; and signal detecting means for converting the parameter shift in the light into a parameter shift signal, for extracting an external component signal from the parameter shift signal, the external component signal representative of the external signal field, and for converting the external component signal into a measurement signal corresponding to the external signal field.

17. The field detection device of claim 16 further including:

means for affixing a first end of said nonlinear transduction material to said optical fiber.

18. The field detection device of claim 17 wherein:

said affixing means is an epoxy adhesive.

19. The fiber optic transducer of claim 1 wherein:

said fluid means is selected from the group consisting of polydimethylsiloxane, trimethylsiloxy terminated, heavy mineral oil, motor oil and household oil.

20. The fiber optic transducer of claim 2 wherein:

said nonlinear transduction material is a magnetostrictive material.

21. The fiber optic transducer of claim 2 wherein:

said nonlinear transduction material is an electrostrictive material.

22. The fiber optic transducer of claim 2 wherein:
said fluid means is a silicone vacuum grease.
23. The fiber optic transducer of claim 2 wherein:
said fluid means is selected from the group consisting of polydimethylsiloxane, trimethylsiloxy terminated, heavy mineral oil, motor oil and household oil.
24. The fiber optic transducer of claim 5 wherein:
said nonlinear transduction material is a magnetostrictive material.
25. The fiber optic transducer of claim 5 wherein:
said nonlinear transduction material is an electrostrictive material.
26. The fiber optic transducer of claim 5 wherein:
said fluid means is a silicone vacuum grease.
27. The fiber optic transducer of claim 5 wherein:
said fluid means is selected from the group consisting of polydimethylsiloxane, trimethylsiloxy terminated, heavy mineral oil, motor oil and household oil.
28. The fiber optic transducer of claim 1 wherein:
said nonlinear transduction material is an electrostrictive material.
29. The fiber optic transducer of claim 12 wherein:
said nonlinear transduction material is a magnetostrictive material.
30. The fiber optic transducer of claim 12 wherein:
said nonlinear transduction material is an electrostrictive material.
31. The fiber optic transducer of claim 12 wherein:
said fluid means is a silicone vacuum grease.
32. The fiber optic transducer of claim 12 wherein:
said fluid means is selected from the group consisting of polydimethylsiloxane, trimethylsiloxy terminated, heavy mineral oil, motor oil and household oil.

\* \* \* \* \*